United States Patent [19]

Frayer et al.

[11] Patent Number: 5,663,907
[45] Date of Patent: Sep. 2, 1997

[54] SWITCH DRIVER CIRCUIT FOR PROVIDING SMALL SECTOR SIZES FOR NEGATIVE GATE ERASE FLASH EEPROMS USING A STANDARD TWIN-WELL CMOS PROCESS

[75] Inventors: Jack E. Frayer, Boulder Creek; John D. Lattanzi, Palo Alto; Shouchang Tsao; Chan-Sui Pang, both of Sunnyvale; Yueh Y. Ma, Los Altos Hills, all of Calif.

[73] Assignee: Bright Microelectronics, Inc., Sunnyvale, Calif.

[21] Appl. No.: 639,296

[22] Filed: Apr. 25, 1996

[51] Int. Cl.$^6$ ........................................... G11C 11/34
[52] U.S. Cl. ............................ 365/185.18; 365/185.27
[58] Field of Search ..................... 365/185.27; 327/536

[56] References Cited

U.S. PATENT DOCUMENTS 5,077,691  12/1991  Haddad et al. ............... 365/185.27
5,491,656  2/1996   Sawada ........................ 365/185.27
5,561,620  10/1996  Chen et al. ................... 365/185.27

*Primary Examiner*—David C. Nelms
*Assistant Examiner*—Michael T. Tran
*Attorney, Agent, or Firm*—Patrick T. King

[57] ABSTRACT

For negative gate erase and programming of non-volatile floating gate EEPROM devices, large positive or negative voltages from one single negative charge pump and from one single positive charge pump are selectively switched onto a one or more memory sectors of twin-well CMOS negative-gate-erase memory cells. The control gate is negative during erasing and positive during programming. In order for FLASH memories to have minimum layout area, small sectors or arrays of EEPROM cells can be erased all at once using a charge pump which includes two pump capacitors to provide negative voltages to the gate terminals of one or more series PMOS transistors.

9 Claims, 15 Drawing Sheets

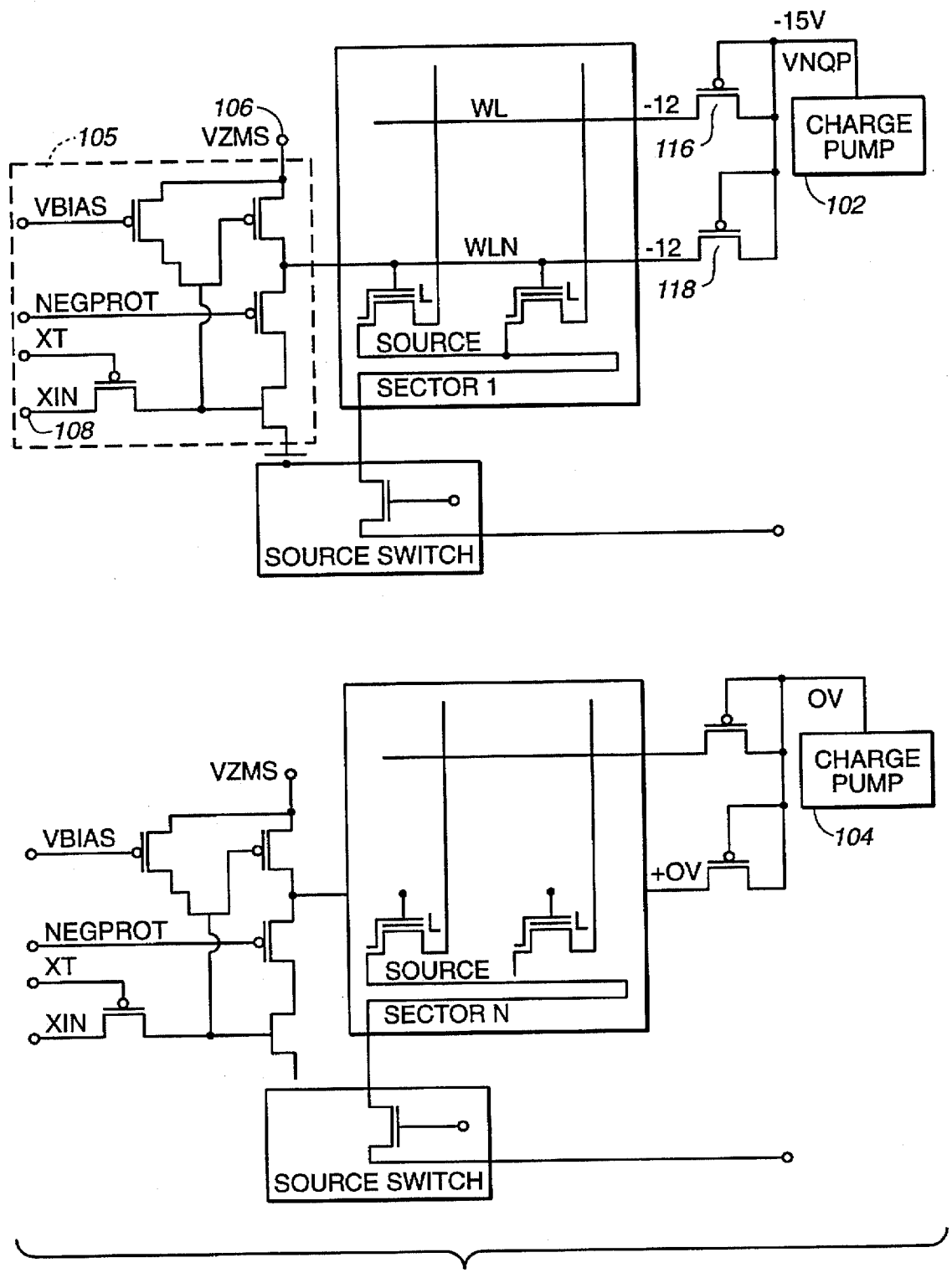
FIG._1
*(PRIOR ART)*

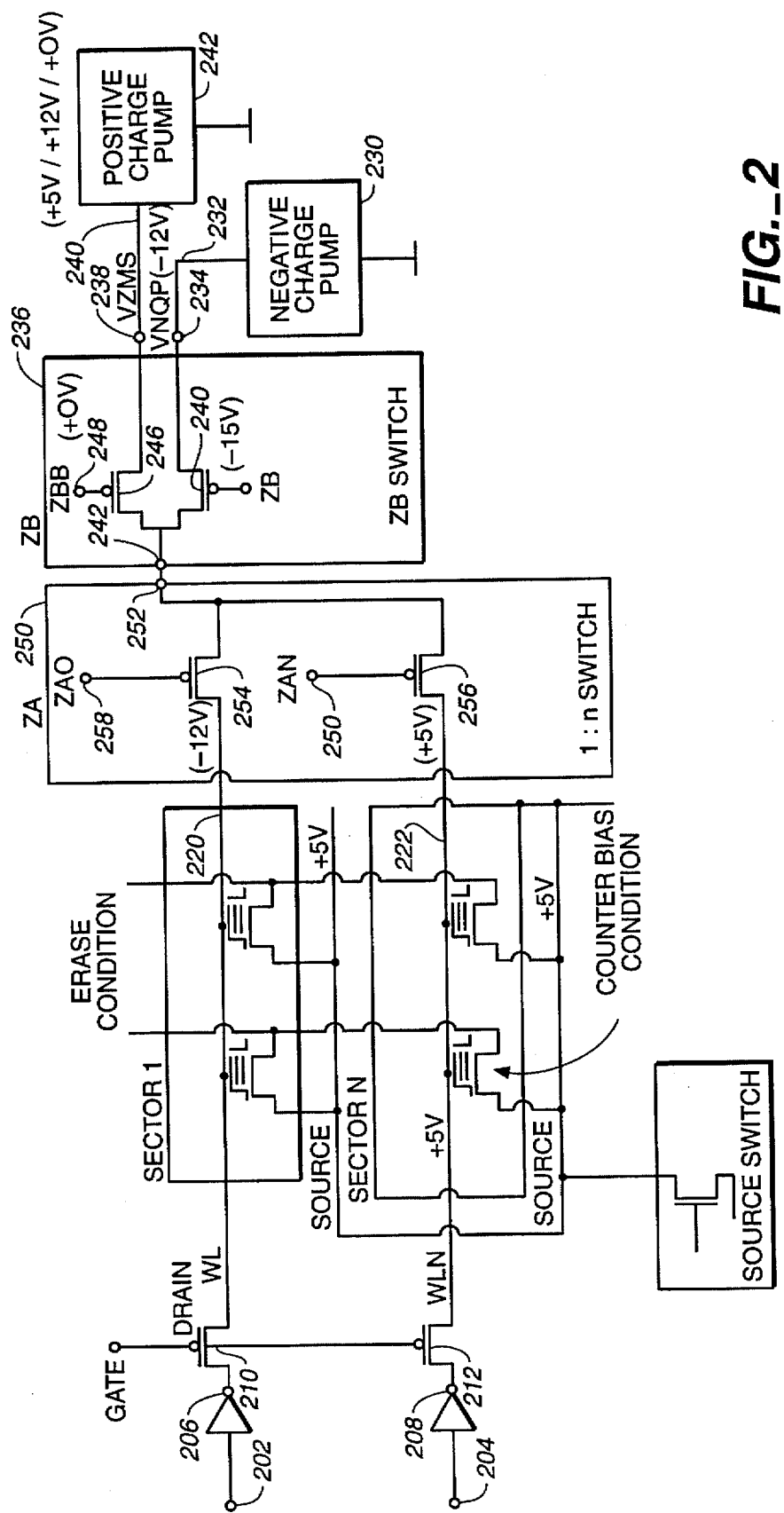
FIG._2

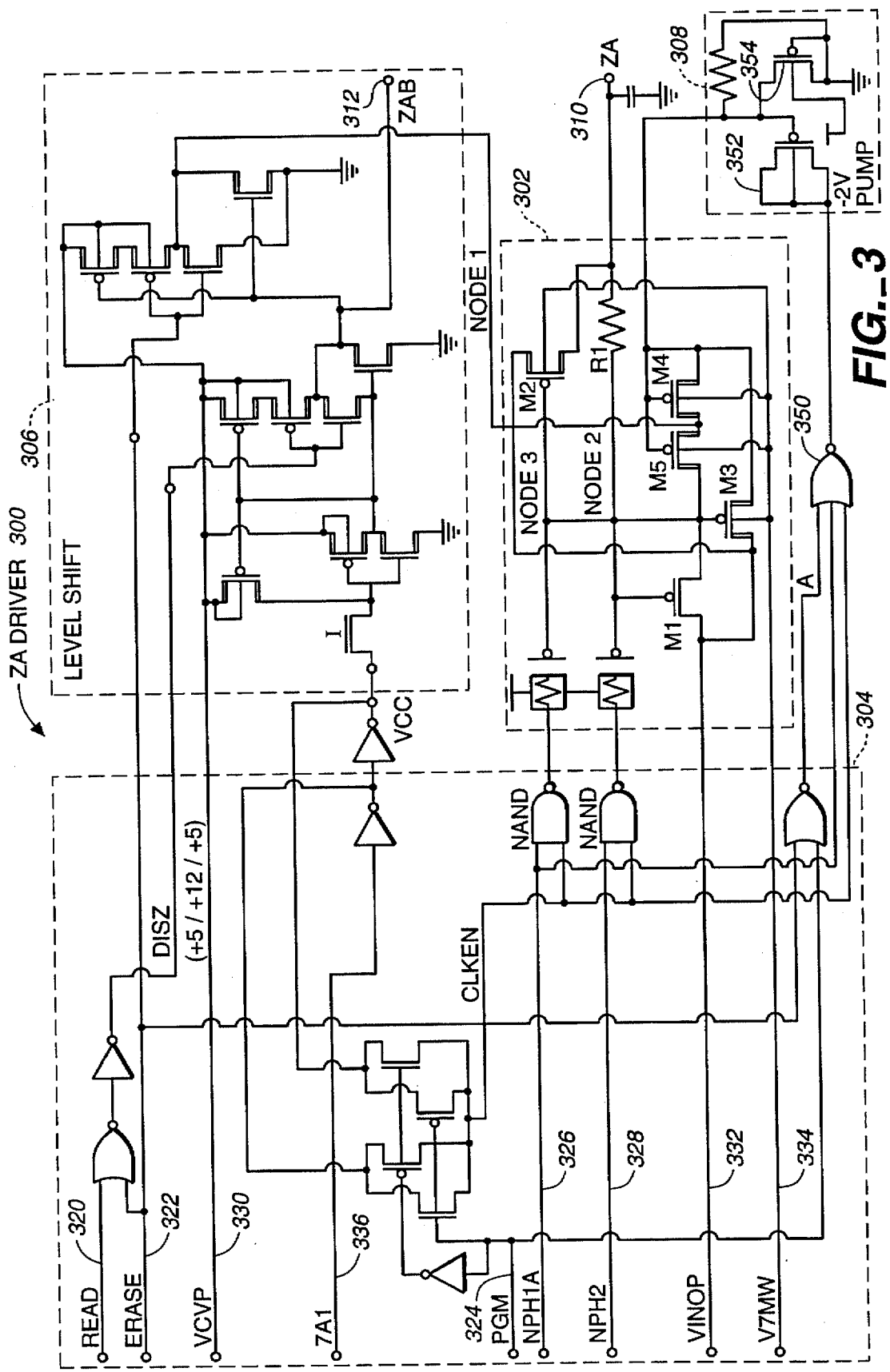
FIG._3

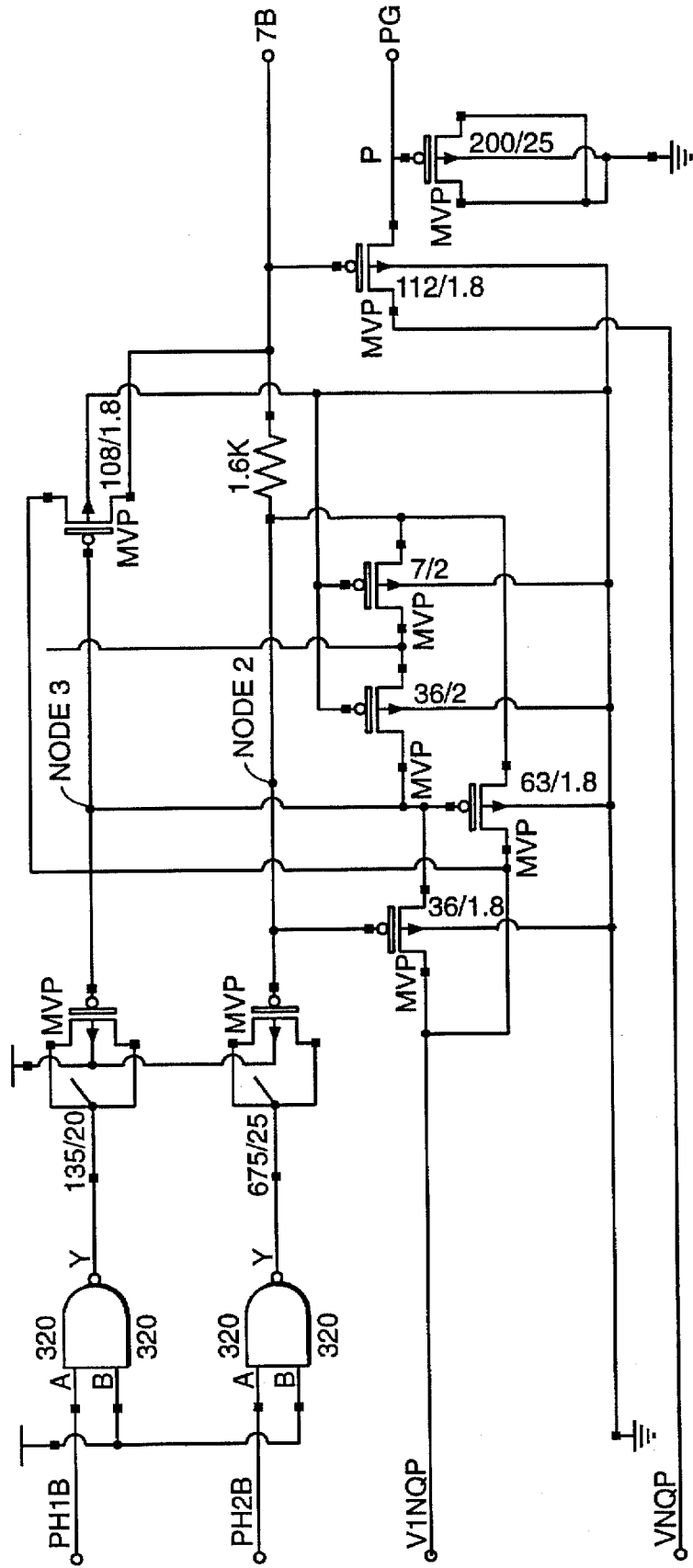
FIG._4

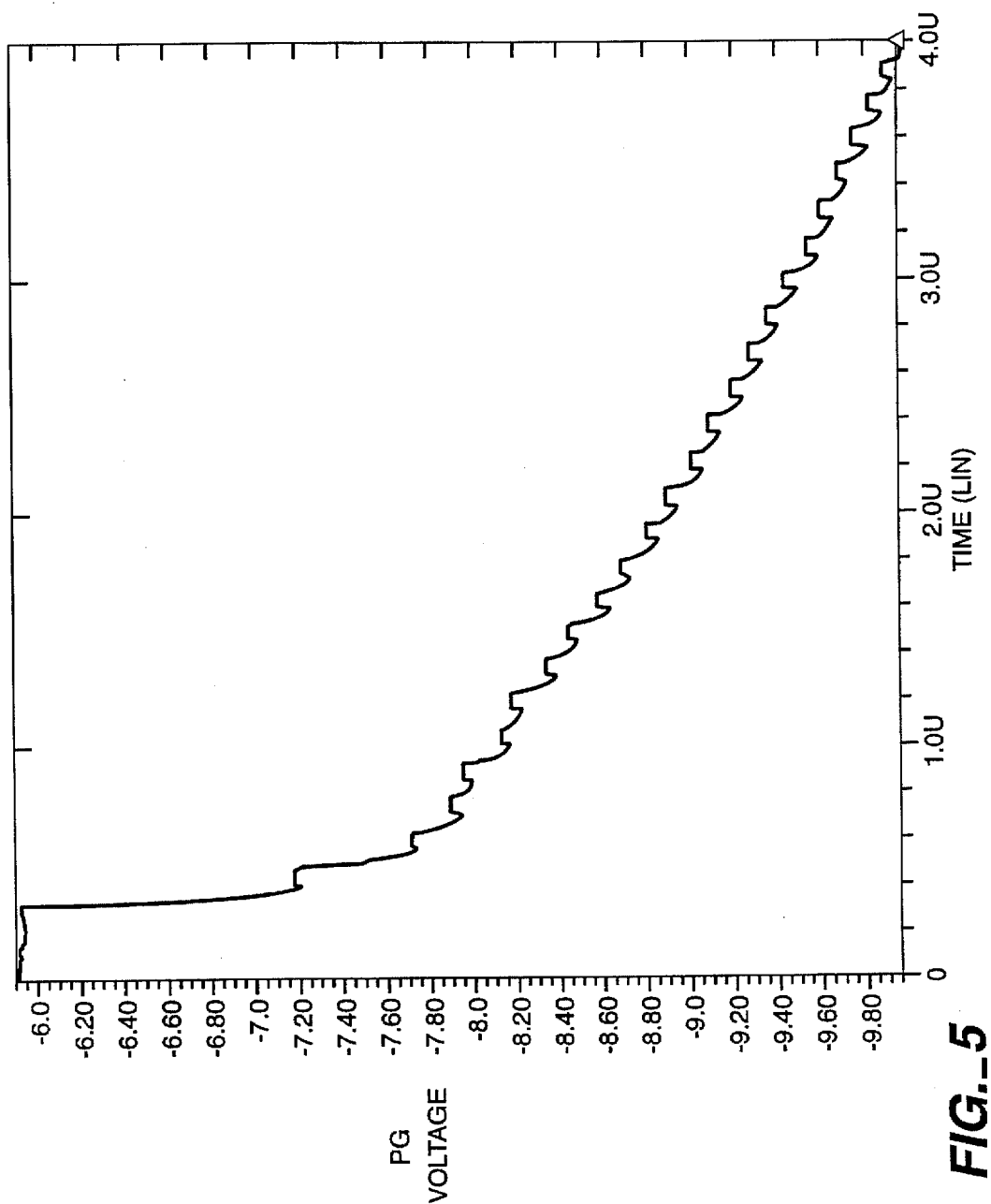
FIG._5

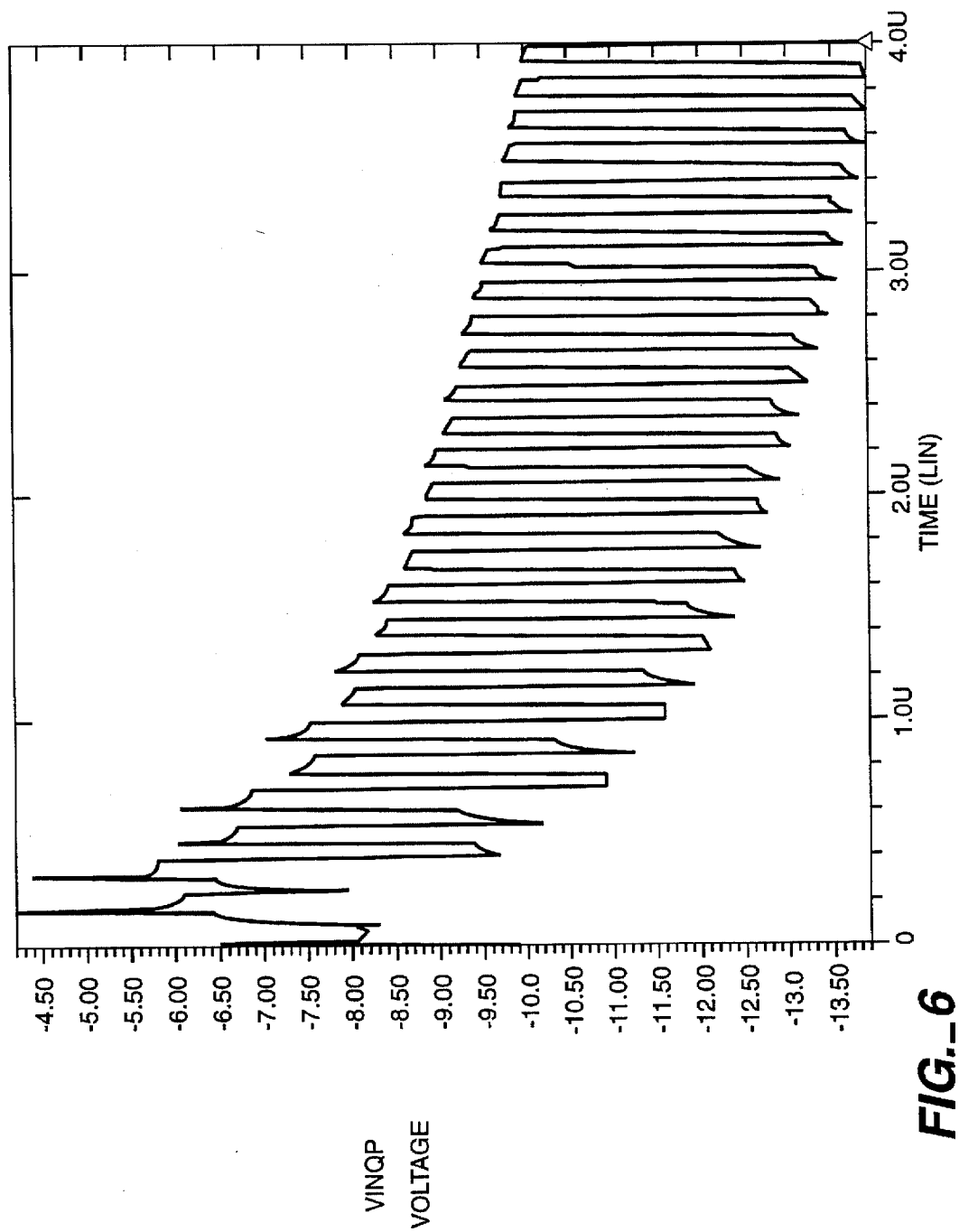
FIG._6

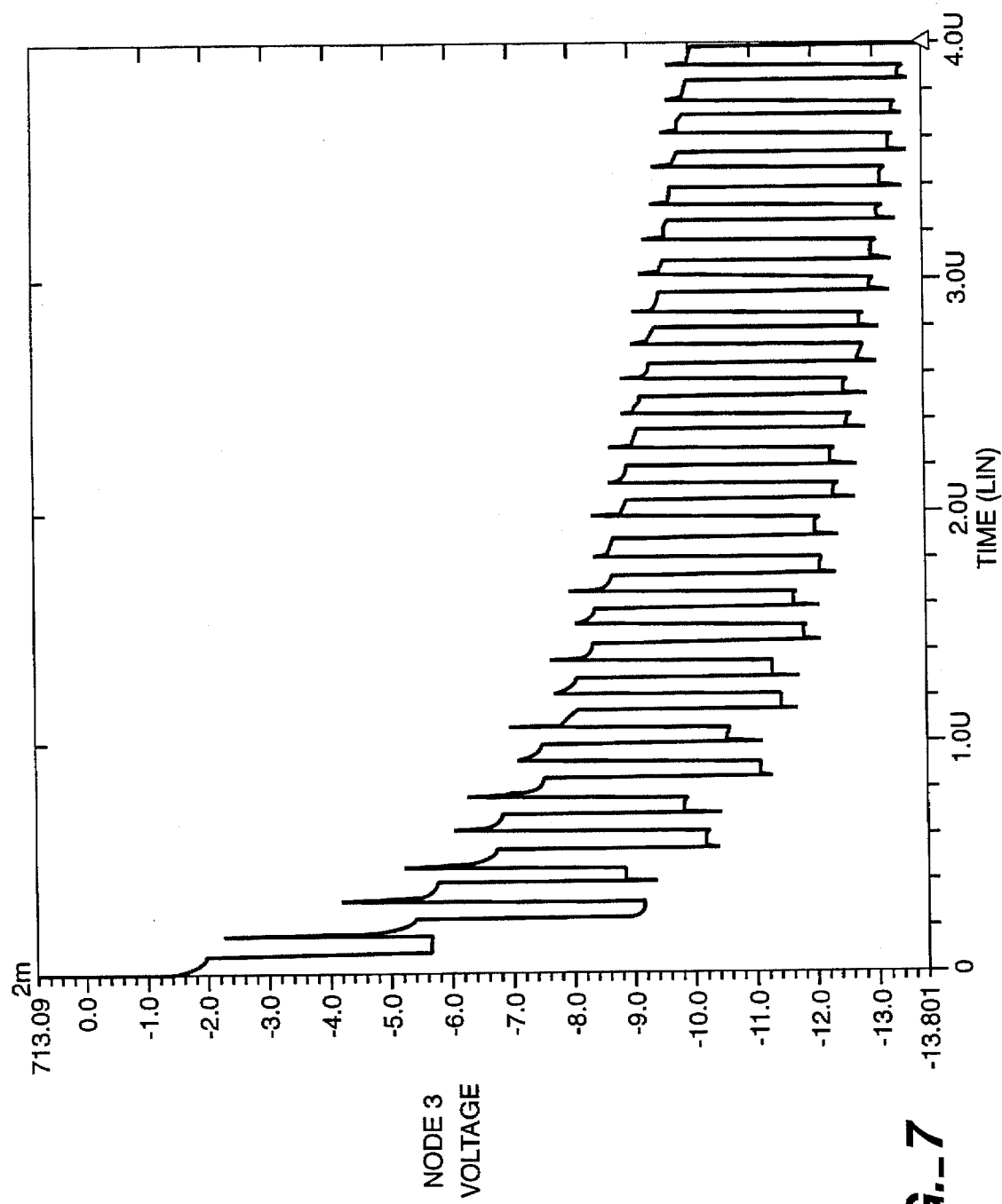
FIG._7

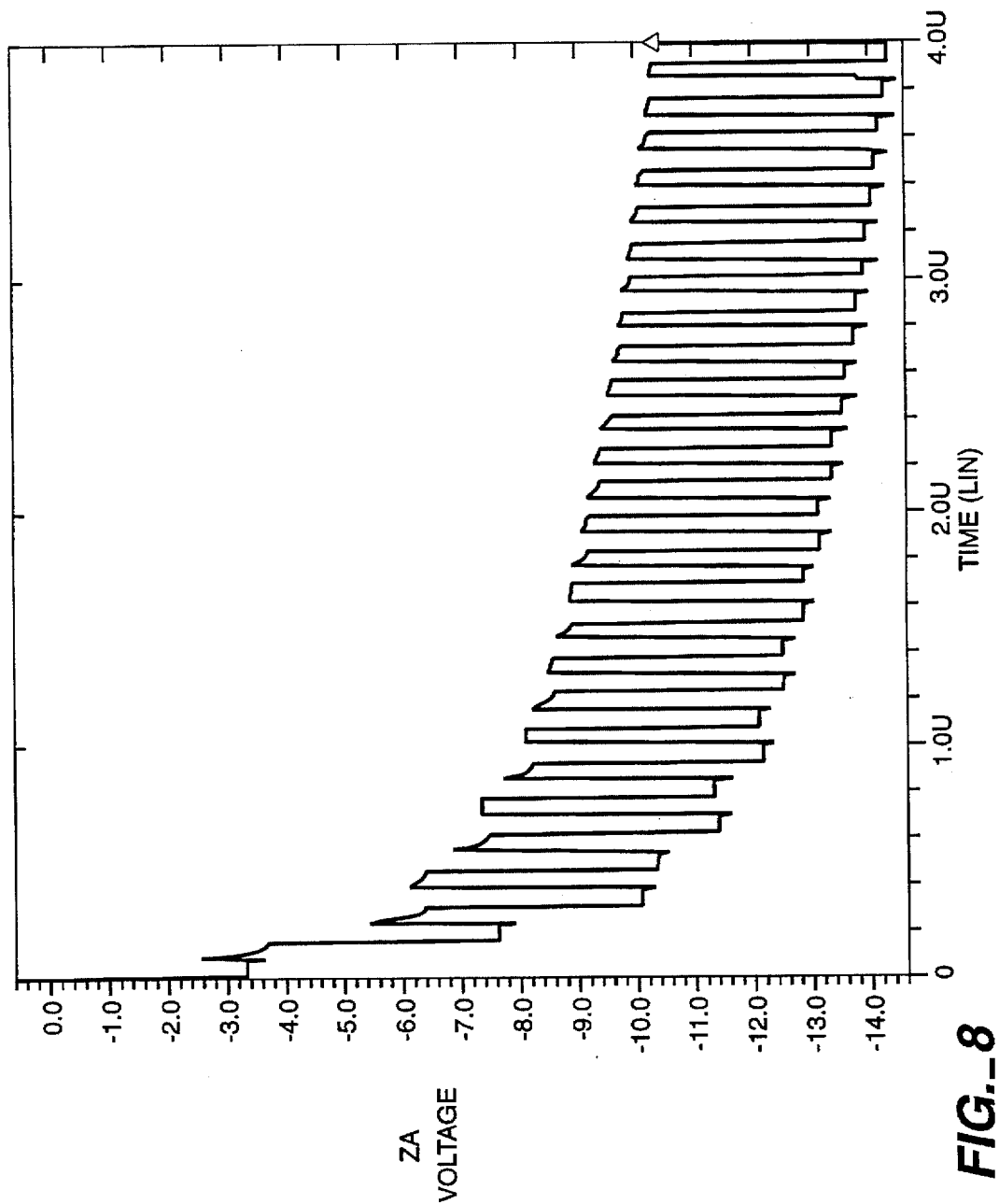
FIG._8

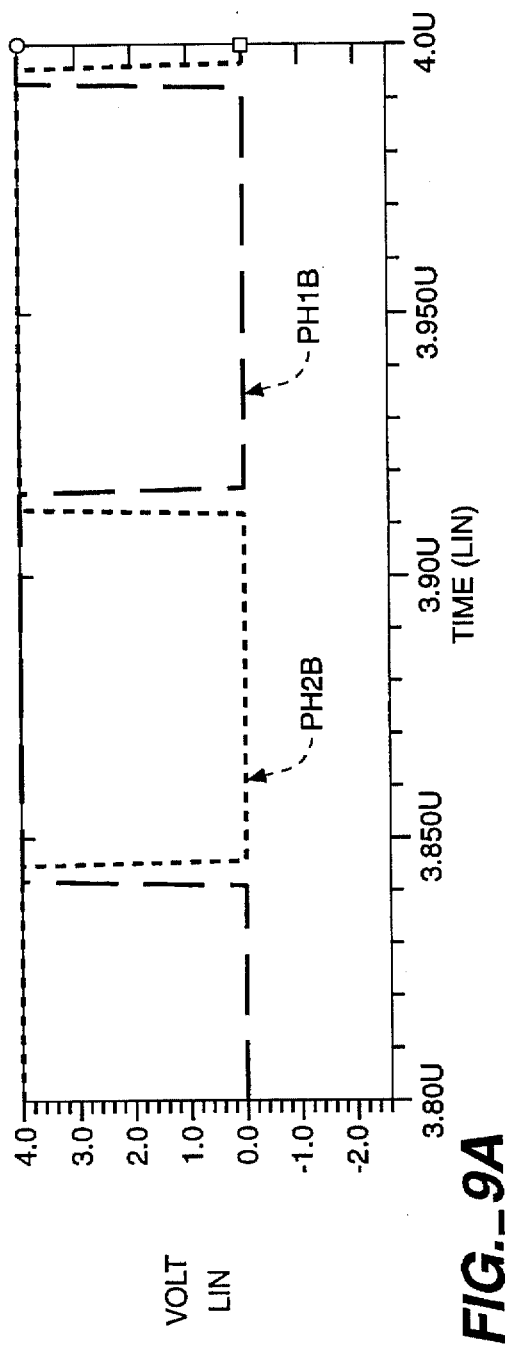
FIG._9A
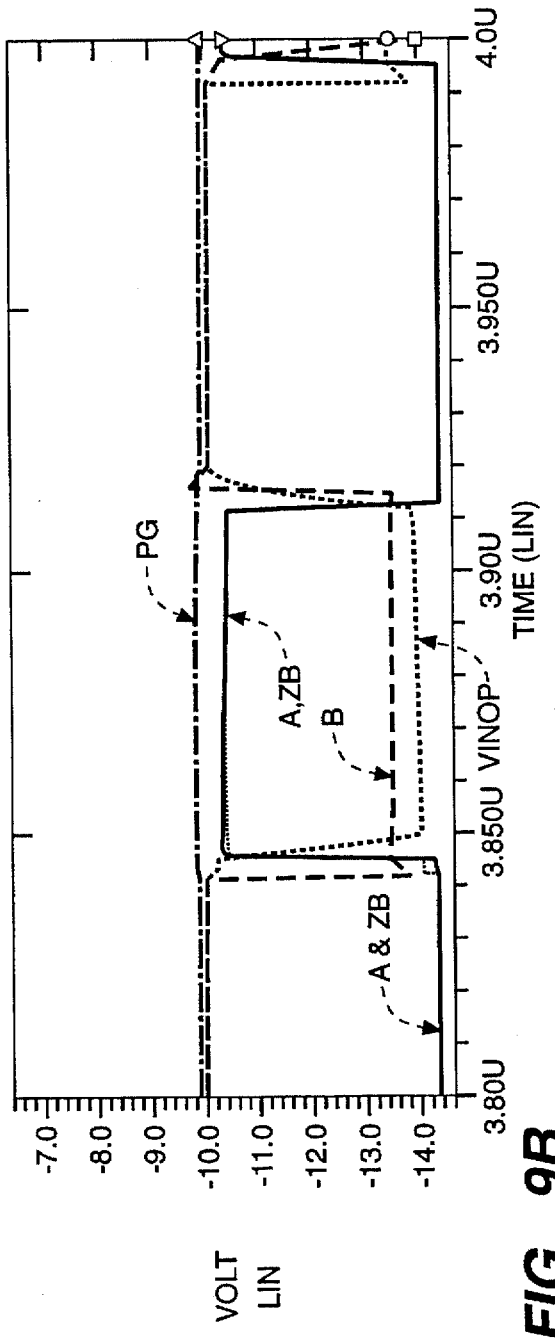
FIG._9B

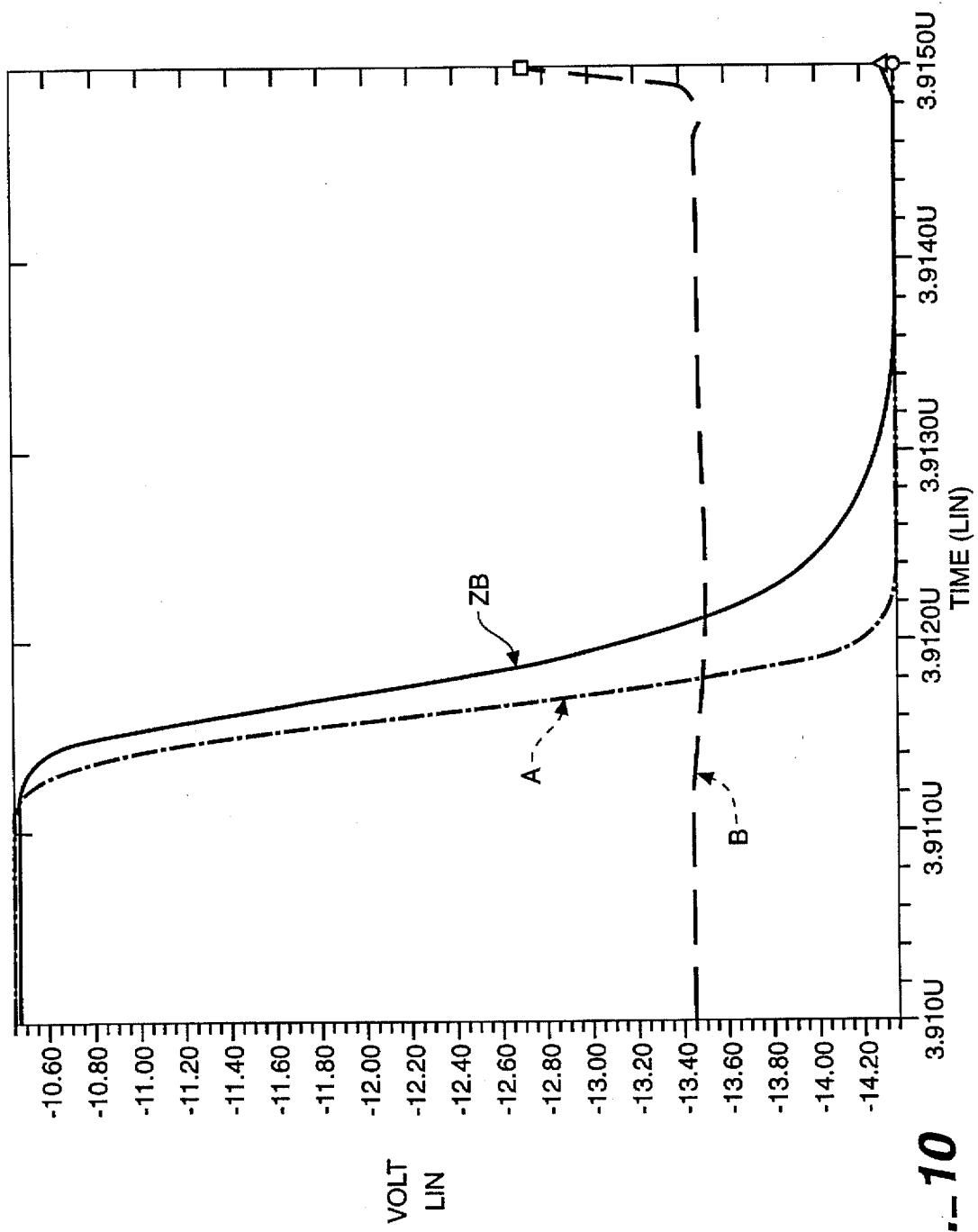
FIG._10

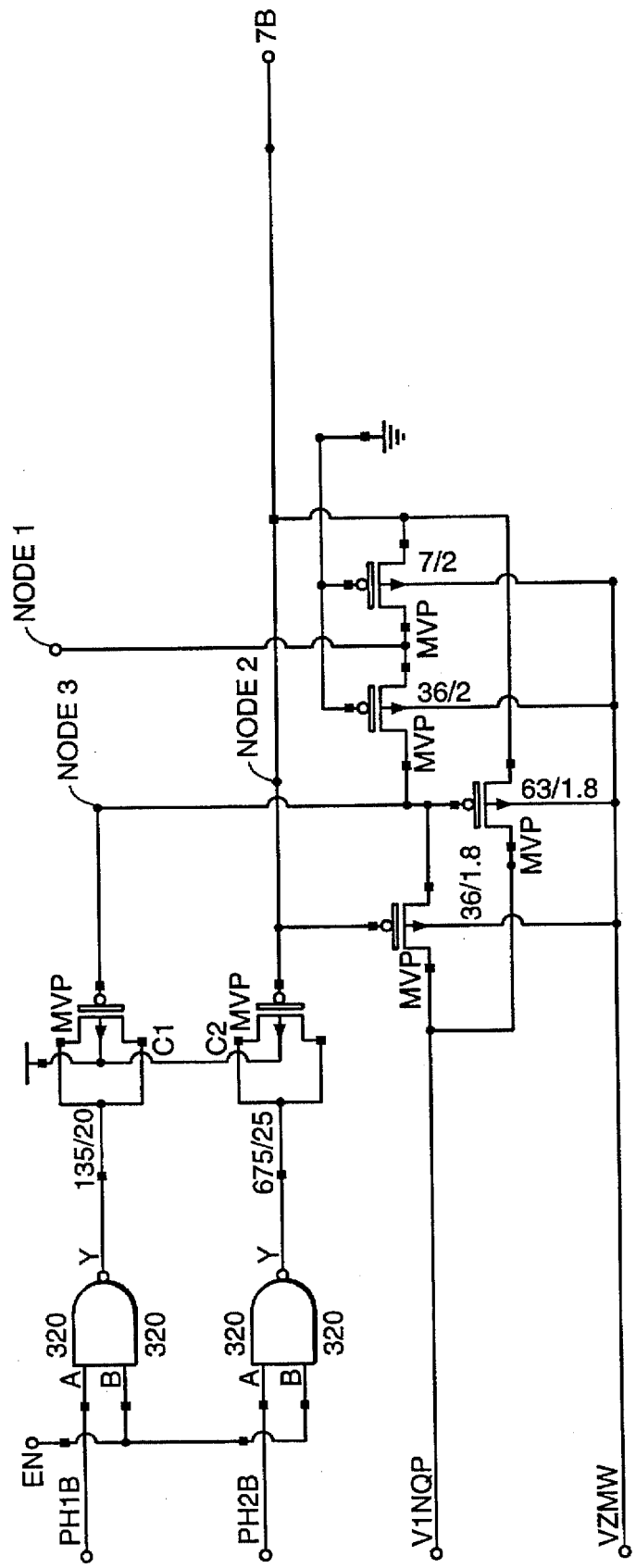
FIG._11

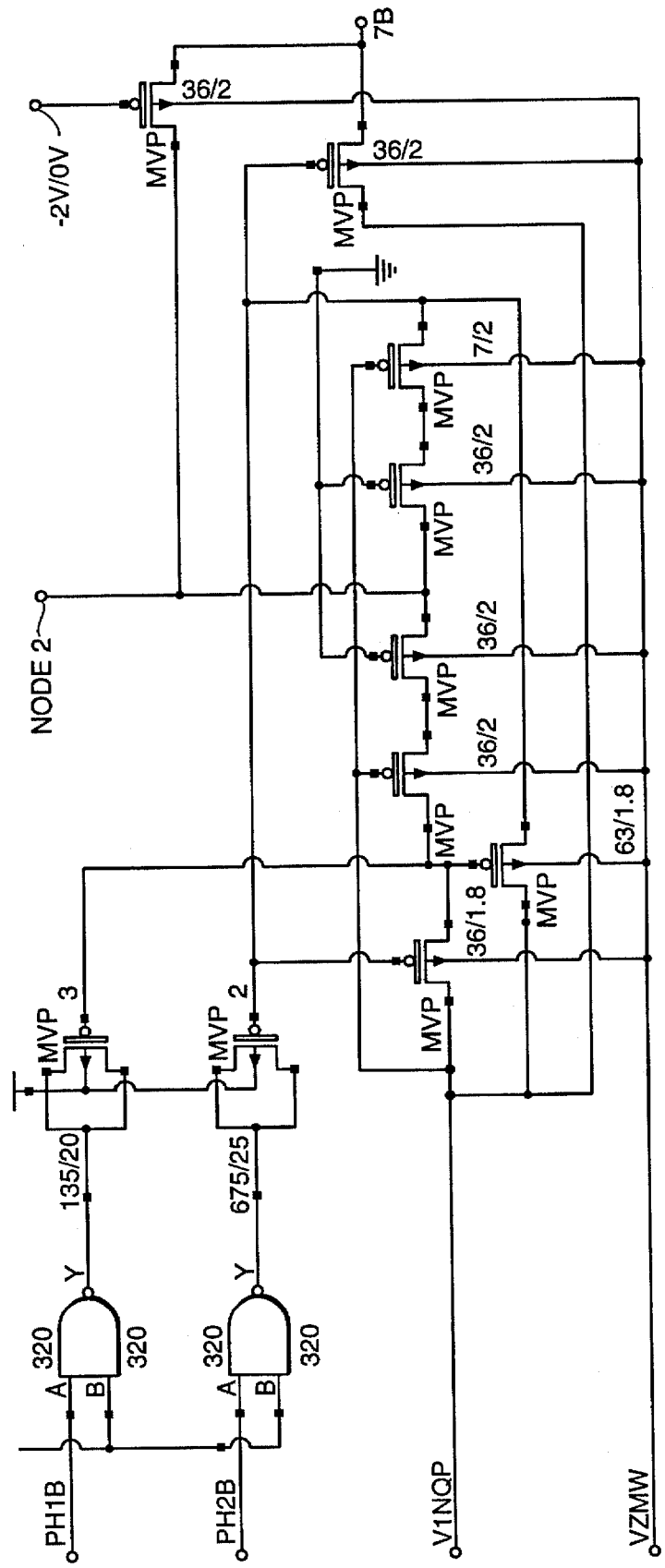
FIG._12

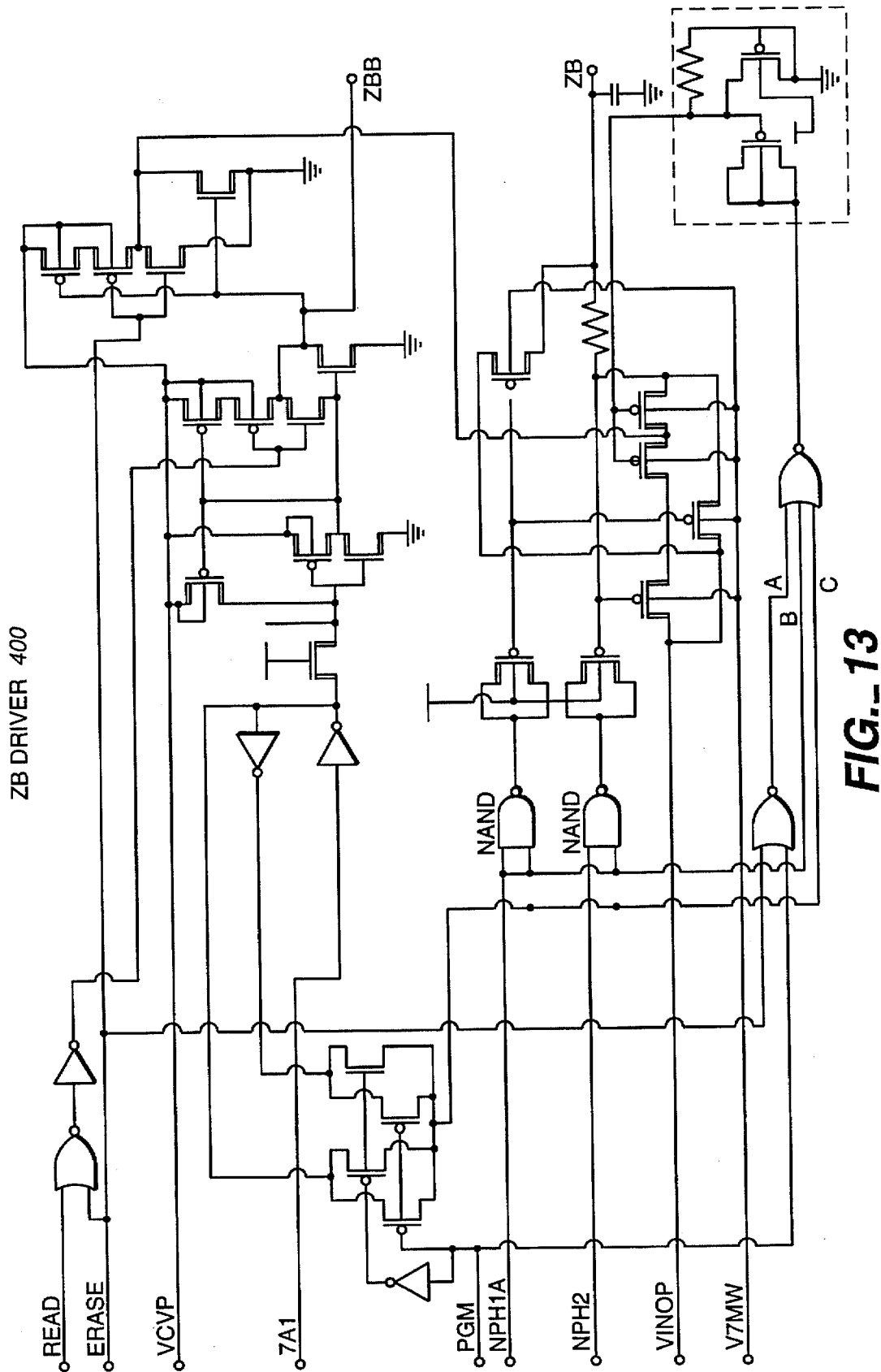
FIG._13

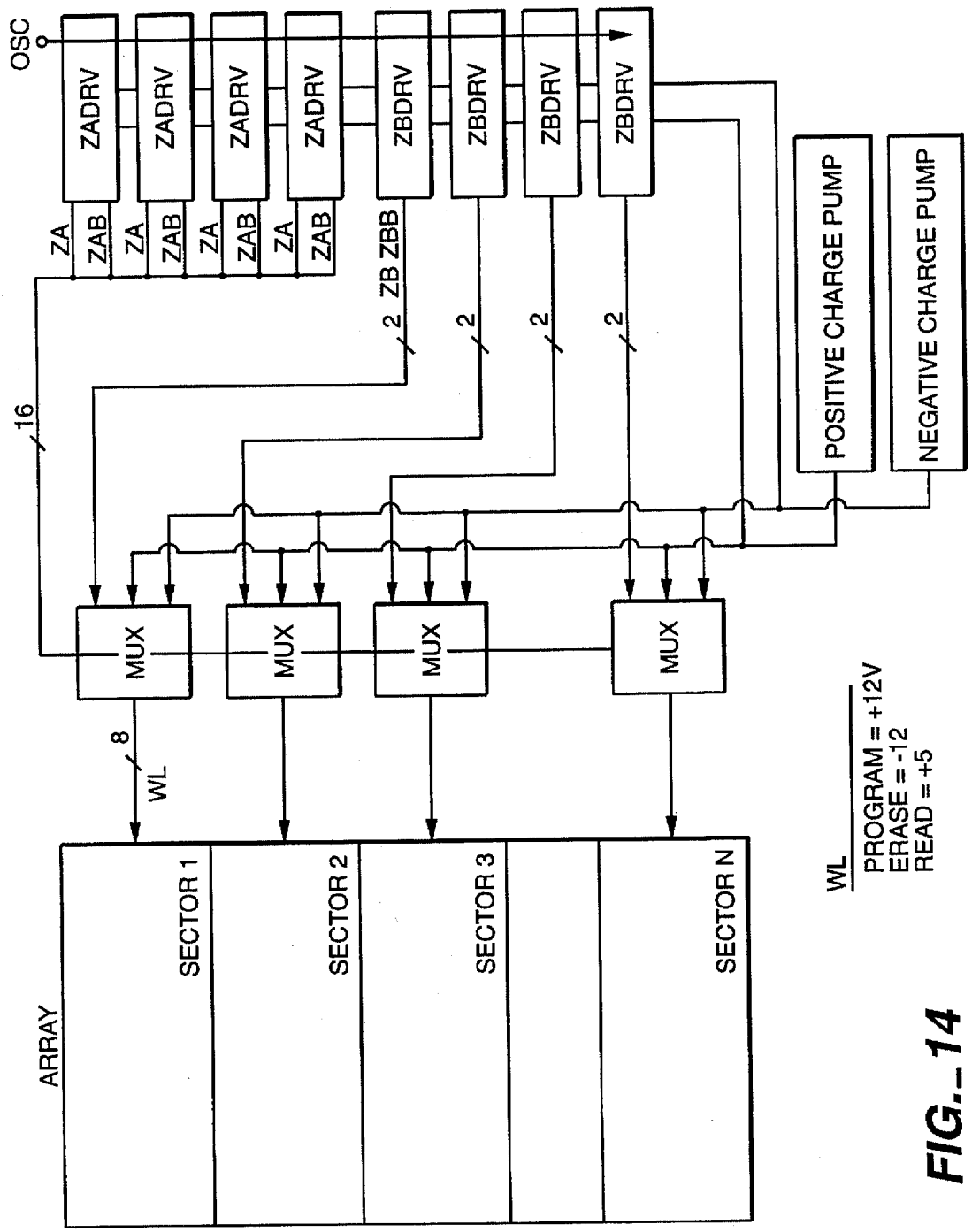
FIG._14

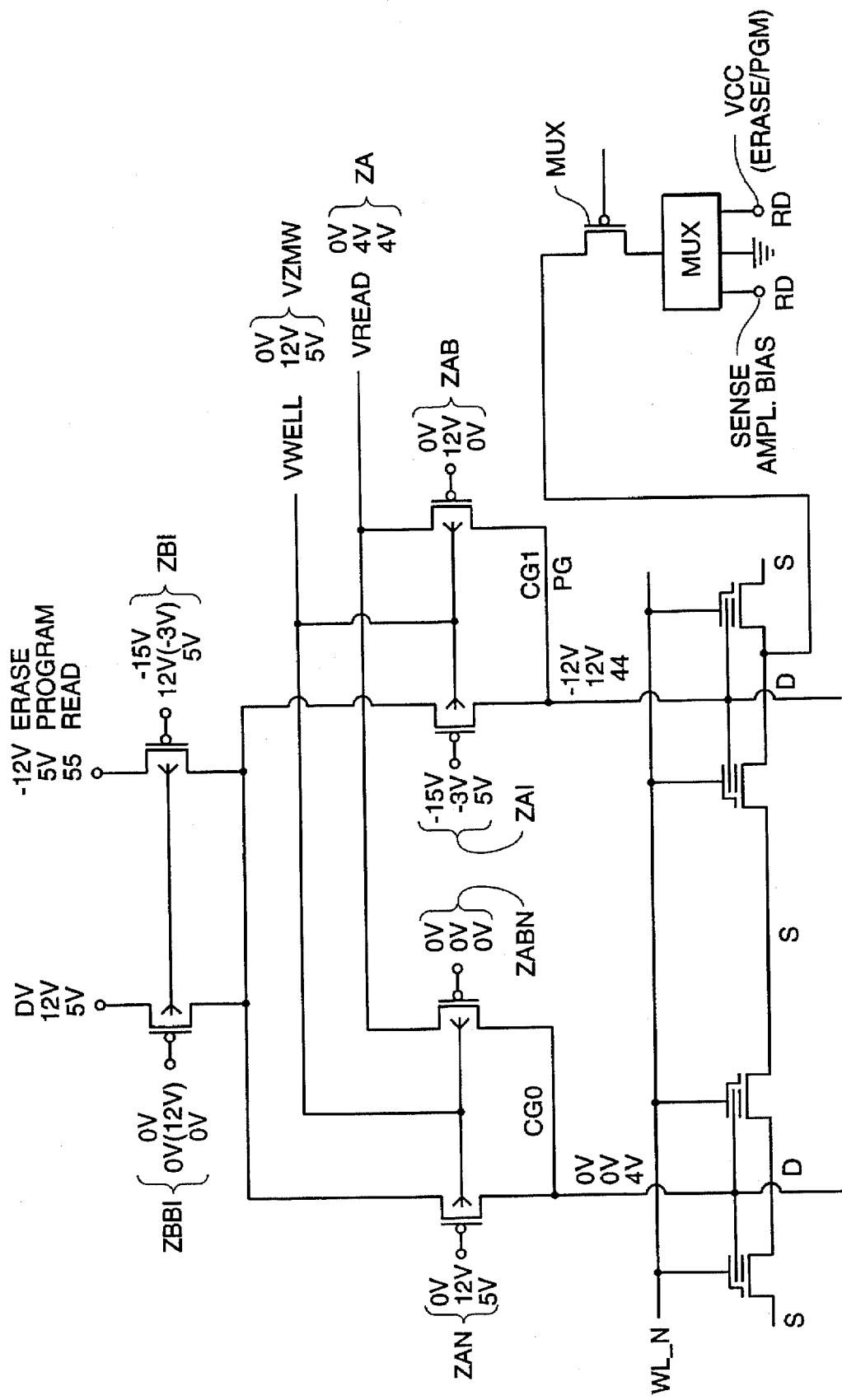
FIG._15

SWITCH DRIVER CIRCUIT FOR PROVIDING SMALL SECTOR SIZES FOR NEGATIVE GATE ERASE FLASH EEPROMS USING A STANDARD TWIN-WELL CMOS PROCESS

BACKGROUND OF THE INVENTION

1. Field of the Invention

This invention relates to floating gate memory devices such as EEPROMs and more specifically to techniques for decoding control signals and for providing signal voltages for the erase, program and read functions of negative-gate-erase FLASH EEPROM arrays.

2. Prior Art

There is a class of non-volatile memory devices known as negative-gate-erase FLASH electrically erasable read only memory (EEPROM) devices. A key feature of FLASH EEPROM technology is having memory storage cells which are relatively small in size. Small size is obtained by either eliminating a select gate or by merging a select gate into a cell as is a split-gate structure. Further elimination of a byte select transistor for a memory cell requires that the erase mode, which is obtained by lowering the gate threshold voltage $V_t$ of a cell, operates on a group of cells called a sector or a page. Principle objectives in designing a FLASH memory device are to obtain the smallest die area, the smallest sector size, the simplest die-fabrication process, and either a large or small sector size, depending upon the applications of the memory device.

Negative gate erase schemes are used for erasing EEPROMS because they provide a more reliable and scaleable method for lowering the threshold voltage $V_t$ of a memory cell. A significant drawback of prior art negative gate erase schemes for EEPROMS is their inability to multiplex, or switch, both positive and negative voltages from central voltage sources to a word line or to a control gate while still keeping the sector sizes small. For prior art implementations which use standard twin-well fabrication processes, erase sector sizes have typically been limited to 64K bytes for 4M flash devices. This limitation is due to the requirement that each sector must have its own separate negative charge pump.

Another significant drawback of prior art negative gate erase schemes occurs when the supply voltage is reduced. At lower voltages, the efficiency of charge pumps are reduced and, consequently, larger dedicated negative charge pumps are required for each sector. Using one large dedicated charge pump per sector limits a sector to a specific group of word lines or control gates. A typical charge pump is either ON to provide −13 volts, OFF to provide +5 volts, or disconnected.

FIG. 1 shows a prior art system 100 for providing the operating voltages for a negative-gate erase FLASH EEPROM array. In this approach, each of n memory sectors requires a Separate, dedicated large local negative charge pump, typically shown as 102, 104, to generate the voltages required to separately drive the word lines or control gates for the individual sectors of the EEPROM array. In this approach, the EEPROM array is divided into a number n of separate large sectors and a single negative charge pump is dedicated to drive only a particular one of those sectors.

On the left side of the Figure is an X decoder and multiplexer circuit 105 which provides for switching between a positive voltage VZMS provided at a terminal 106 and a decoded row select signal XIN provided at a terminal 108. XIN is used during a normal "read" mode of operation and during a "program" mode of operation. XIN goes between 0 and VCC. XIN designates which row is to be read or programmed and function as a Row Select signal.

VZMS is used for reading or during a programming operation. VZMS is either at VCC, the power supply level, during a normal read mode or at some high voltage which is used during the programming mode.

In FIG. 1, two typical sectors of a group of n sectors are shown, where the top sector is designated SECTOR 1 and the bottom sector is designated SECTOR n. Each sector is a array of memory cells formed from an array of EEPROM transistors, typically shown as a device 110 having a drain terminal D connected to a bit line B10, a control gate CG connected to a word line WLn, a floating gate, and a source terminal S.

The source terminals of all of the cells in a sector are connected together and through a source switch transistor 112 to a control line 114. Each sector has its own source line and a source selection line so that the source line goes up and down in voltage depending upon read, program and erase operations. During programming the source line needs to be plus five volts, which is controlled by the source switches which connect VCC or ground to the sources of the array. A decoder selects the sector to be programmed or erased by providing five volts on the control line 114. The other unselected sectors are kept at zero volts to keep them inactive. Sector n has a similar arrangement.

The negative charge pump voltage VNQP for erasing the cells of Sector 1 is provided from the dedicated charge pump 102 through diode-connected transistors 116, 118 to the various word lines for the cells of the sector. The diodes group several word lines together to form a sector. A group of word lines, for example, 16 or 32, form a sector. Note that each sector, or group of word lines, (1 through n) is driven by its own individual, dedicated charge pump, as shown. VNQP is −15 volts for an erase operation and −12 volts is then applied from the diode output terminals to the word lines WL0 through WLn of a sector.

The operation and structure of an EEPROM memory array where each sector has its own charge pump, such as described in connection with FIG. 1, is discussed in U.S. Pat. No. 5,077,691, issued Dec. 13, 1991, to Haddad et al.

Twin-well CMOS processes are well known for fabrication of EEPROMs and providing the appropriate voltages for programming, reading, and erasing typically requires using a number of dedicated charge pumps, each driving only one sector of the array.

A more complex, non-standard, fabrication process known as a triple-well process can be used to make the switching of positive and negative voltages possible. Adding a third well requires special equipment and manufacturing expertise. As a result, the triple-well process adds considerable complexity to a FLASH fabrication process and makes manufacturing more difficult.

Consequently, a need exists for a twin-well CMOS system which can provide the operational voltages for all of the different sectors of a negative-gate erase FLASH EEPROM array by using a single negative voltage supply and a single positive voltage supply for all of the sectors of the array and which can also provide a way to decode and steer the required voltages to the array.

SUMMARY OF THE INVENTION

It is therefore an object of the invention to provide a twin-well system which provides the operational voltages used for a negative-gate erase FLASH EEPROM array having a single negative voltage supply for all of the different sectors of the array.

For conventional twin-well CMOS semiconductor fabrication process technology, the prior art provides only two choices for a switch circuit: a negative voltage or a positive voltage. The invention provides three choices for a CMOS twin-well process: a negative voltage, zero voltage, and a positive voltage.

In accordance with the invention, control signals that have high positive and negative voltages as well as intermediate voltage levels are generated according to the invention. These signals are then applied to P-channel switches that drive selected word line or control gates of a FLASH cell to high negative or high positive voltages.

The scheme of the invention allows having a large central pump with local switching. This system includes a decoder, a level shifter switch, and a −2 V charge pump to compensate for threshold drops.

A driver circuit is provided according to the invention which selectively provides a negative, zero, and positive voltage for controlling a switch. The switch selectively provides positive, zero, or negative voltages from either a centralized positive-voltage charge pump or from a centralized negative-voltage charge pump to read, program, or erase selected sectors of memory cells in a negative-gate twin-well CMOS FLASH EEPROM array.

The driver circuit includes a switch circuit having a switch output terminal where the switch circuit including a first pump capacitor (C1) having a first terminal and a second terminal (Node 3). The first terminal of capacitor C1 is connected to the output terminal of a first alternating signal source. The second terminal of capacitor C1 is connected to the gate terminal of a first series pass transistor (M2). The first series pass transistor has a first terminal connected to a negative voltage supply terminal and the first series pass transistor has a second terminal connected to the switch output terminal.

A second pump capacitor (C2) has a first terminal and a second terminal (Node 2), where the first terminal is connected to the output terminal of a second, oppositely-phased alternating signal source. The second terminal of the second pump capacitor is connected to one terminal of a series resistor (R1). A second terminal of the series resistor is connected to the switch output terminal and he second terminal of the second pump capacitor is connected to a gate terminal of a second series pass transistor (M3).

A first terminal of the second series pass transistor is connected to the negative voltage supply terminal and a second terminal of the second series pass transistor is connected to the second terminal of the first pump capacitor.

The combination of the two capacitors acting in parallel makes nodes 2 and 3 drop approximately minus three volts from the negative charge pump voltage VNQP and enable M2 and M3 to pass voltage to ZA from V1NQP for the negative voltage path.

The driver circuit also includes a positive voltage supply terminal (Node 1) and a first terminal of a fourth series pass transistor (M4) is connected to the positive voltage supply terminal. A second terminal of the fourth series pass transistor is connected to the first terminal of the series resistor.

A decoder circuit having respective input terminals for receiving a read mode control signal READ, a program mode control signal PGM, an erase mode control signal ERASE, a negative charge pump 15 volt signal V1NQP (0/0/−15), two clock signals having opposite phases and used for programming and erase operations, ZAI, a positive charge pump voltage VCVP (+5/+12/+5), and a control signal VZMW (+5/+5/0).

The decoder circuit includes a clock enable circuit for gating the two clock signals having opposite phases to provide the first alternating signal and the second alternating signal. The driver circuit includes a level shifter circuit for shifting a positive voltage provided at the positive voltage supply terminal. The driver circuit includes a −2 volt charge pump providing an output voltage connected to a gate terminal of the fourth series pass transistor.

The switch circuit provides the operating voltages for a read mode, a programming mode, and an erase mode for memory cells of a negative gate twin-well CMOS FLASH EEPROM array from a single, central positive voltage charge pump and from a single, central negative charge pump. A local charge pump can also be provided by C1 and C2 when C1 and C2 are pumping and a large negative voltage is not applied to the first and second series pass transistors so that −3 volts is provided on nodes 2 and 3.

The switch drive circuits are used with a system for providing read, programming, and erase voltages to selected sectors of negative-gate-erase memory cells. The system includes a single negative charge pump providing a negative output voltage and a single positive charge pump providing a positive output voltage.

The system also includes a first switch which has a first input terminal connected to the negative output voltage, which has a second input terminal connected to the positive output voltage, and which has an output terminal which is selectively connected to the first input terminal of to the second input terminal. The switch includes control terminals at which are provided first-switch control signals for selectively connecting the first or second input terminals of the first switch to the output terminal of the first switch.

A ZBDRV switch drive circuit selectively provides a negative voltage, an intermediate voltage, or a positive voltage from the single negative charge-pump or from the single negative charge pump to the control terminals of the first switch.

A sector switch array has an input terminal connected to the output terminal of the first switch and includes a plurality of switch transistors, each of which switch transistors has an input terminal connected to the output terminal of the first switch. Each of the switch transistors has an output terminal connected to a respective sector of negative-gate-erase memory cells for providing read, programming, and erase voltages to said respective sectors and wherein each of said plurality of switch transistors includes a control terminal. A plurality of ZADRV sector switch drive circuits each respectively provide a control signal to an associated switch transistor of the sector switch array for selectively combining respective sectors of negative-gate-erase memory cells for providing read, programming, and erase voltages to the respective combined sectors.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a circuit diagram of a typical Prior Art NOR structure implementation of an EEPROM using separate charge pumps for each sector.

FIG. 2 is a circuit diagram of a NOR array embodiment of an EEPROM array which uses switch driver circuits according to the invention.

FIG. 3 is a circuit diagram of one embodiment of a switch driver ZA DRIVER, which drives the switching circuits of FIG. 2 and which includes a switch circuit, a decoder circuit, a level shift circuit, and a −2 volt charge pump circuit.

FIG. 4 is a circuit diagram of a switch circuit for the switch driver circuit of FIG. 3 which includes a circuit for providing a PG output voltage from the ZB voltage.

FIG. 5 is a diagram showing the PG voltage of FIG. 4 as a function of time.

FIG. 6 is a diagram showing a V1NQP input voltage to the switch circuit of FIG. 4 as a function of time.

FIG. 7 is a diagram showing a Node 3 voltage of FIG. 4 as a function of time.

FIG. 8 is a diagram showing a switch output circuit ZA voltage of FIG. 4 as a function of time.

FIG. 9A is a diagram showing the PH1B and the PH2B input clock signals of FIG. 4 as functions of time with an expanded time scale.

FIG. 9B is a diagram showing the voltages of A&ZB, B, V1NQP, and PG as functions of time with an expanded time scale.

FIG. 10 is a diagram showing the voltages A&ZB and B as functions of time with an even more expanded time scale.

FIG. 11 is a circuit diagram another embodiment of a switch circuit for a switch driver according to the invention.

FIG. 12 is a circuit diagram of still another embodiment of a switch circuit for a switch driver according to the invention.

FIG. 13 is a circuit diagram of one embodiment of a switch driver ZB DRIVER according to the invention.

FIG. 14 is a block diagram of an example of an array implementation of an EEPROM using the invention.

FIG. 15 is circuit diagram of a control gate decode structure for a source-side injection type of memory array.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

FIG. 2 is a circuit diagram which illustrates an application to representative memory sectors of a memory integrated circuit, or chip, using switch driver signals provided according to the invention on the chip. The present invention provides the ability to switch operating voltages on a chip to a selected word line (WLO) from either one central positive on-chip charge pump or from one central on-chip negative charge pump. For an erase mode of operation of the memory chip, a selected word line (WLO) is forced to −12 volts, while the source or drain of the memory cells in some technologies are forced to +5 volts. This provides a high potential across a tunneling dielectric, which ultimately causes the threshold of the selected cells to decrease, or to be erased.

An unselected word line must be biased at +5 volts to reduce tunneling stress. By keeping the voltage potential across the tunneling dielectric to a minimum, such as 0 volts, erase disturbances through Fowler Nordheim tunneling between the word line and the source of an unselected cell are reduced.

Switches are used to switch the voltages from the two centralized charge pumps. A set of control Signals ZAn, ZB and ZBB are generated (as described in connection with FIGS. 3 and 13 herein below) from logic signals ZAI and ZBI, where ZAI and ZBI are generated from a standard memory decoder.

The output signals from the switches provide the proper voltage signals for reading, programming, and erasing a number of different EEPROM cells from one of two single centralized charge-pump voltage sources. FIG. 2 shows switching of voltage signals onto the word line of an EEPROM array having a number of sectors, typically shown as Sector 1 and Sector n. The EEPROM array shown is a NOR type memory array.

X decoder input signals are either 0 volts or +5 (VCC) volts and are provided from row decoding circuits at input terminals 202, 204. These X decoder input signals are passed through respective buffer inverters 206, 208 to the drain terminals of respective PMOS pass transistors 210, 212, which are used to isolate the word lines of each sector from the row decoding circuits. The X decoder voltages at the output terminals of the respective buffer inverters 206, 208 are passed through respective PMOS pass transistors 210, 212 to provide voltages to the drain terminals of the PMOS transistors 210, 212 which are required during read, program, and erase modes of operation.

For a selected word line in the read mode of operation, the X decoder voltage at the drain terminal of a PMOS pass transistor is +5 volts and the gate terminals of a PMOS pass transistor is at −2 volts. In the program mode, the X decoder voltage at the drain terminal of a PMOS pass transistor is also +5 volts and the gate terminals of the PMOS pass transistor is at +12 volts.

For a selected word line in the erase mode of operation, the X decoder voltage at the drain terminal of a selected PMOS pass transistor is 0 volts and the gate terminals of a PMOS pass transistor is at 0 volts, which turns off the PMOS pass transistor. This permits −12 volts to be on the word lines of a respective selected word line 220, 222.

For an unselected word line in the read mode, the X decoder voltage at the drain terminal of a PMOS pass transistor is 0 volts and the gate terminals is at −2 volts. In the program mode, the X decoder voltage at the drain terminal of a PMOS pass transistor is +5 volts and the gate terminals is at +12 volts.

For a unselected word line in the erase mode, the X decoder voltage at the drain terminal of a selected PMOS pass transistor is +5 volts and the gate terminal is at 0 volts.

The −12 volts provided to a word line for erasing a memory cell is provided from a central −12 volt charge pump 230, which provides a −12 volt VNQP voltage on a power line 232. Line 232 is connected to one input terminal 234 of a 2:1 ZB switch 236. The other input terminal 238 of the 2:1 switch 236 is connected to a power line 240 from a central VZMS positive charge pump, which provides positive voltages. The VZMS charge pump 242 in the read mode provides +5 volts, in the program mode +12 volts, and in the erase mode 0 volts.

The 2:1 ZB switch 236 is operated by appropriate control voltages to select a positive or negative voltage for connection to the word lines of sectors selected for reading, programming, or erasing operations.

The 2:1 switch 236 includes a first PMOS transistor 240 which has its drain terminal connected to the input terminal 234 for the −12 volt VNQP voltage. The source terminal of the first PMOS transistor 240 is connected to the output terminal 242 of the 2:1 switch 236. The gate terminal 244 of the first PMOS transistor 240 is connected to a ZB control signal. The 2:1 ZB switch 236 also includes a second PMOS transistor 246 which has its drain terminal connected to the input terminal 238 for the positive VZMS voltage. The source terminal of the second PMOS transistor 246 is also connected to the output terminal 242 of the 2:1 switch 236. The gate terminal 248 of the second PMOS transistor 244 is connected to a ZBB control signal.

A 1:n ZA switch array 250 is used to select those sectors to which the output voltage of the 2:1 switch 236 is applied. The 1:n ZA switch array 250 takes one of the positive or negative voltages from the centralized charge pump 230, 242 and applies it in parallel to sectors selected by ZAn signals. An input terminal 252 of the switch array 250 is connected to the output terminal 242 of the 2:1 switch 236. The input terminal 252 is connected to the drain terminals of a number of PMOS transistors. Two of the transistors 254, 256 are typically shown in the Figure. The source terminal of transistor 254 is connected to word line WL0. The gate terminal of transistor 254 is connected to a ZA0 control signal input terminal 258. Similarly, the source terminal of transistor 256 is connected to word line WLN and the gate terminal of transistor 246 is connected to a ZAN control signal input terminal 250. Each or all of the sectors selected depending on which of the ZA0–ZAN control signals are generated.

The positive VZMS voltages and the negative VNQP voltage both come from a centralized large charge pump as shown, where the charge pump 242 is provides positive or zero voltages and the other charge pump 230 provides a negative voltage.

An important requirement for using the system shown in FIG. 2 is the generation of the ZB, ZBB, ZAn (ZA0–ZAN) signals which are used to control the switches 236, 250 where the switches provides the required positive and negative control voltages for read, program, or erase modes of operation for the selected sectors.

FIG. 2 illustrates one application for the switch driver signals provided according to the invention and described herein below in connection with FIGS. 3 and 13. The invention is not limited to a NOR array application of the invention. Various EEPROM architecture types other than NOR types of EEPROM architectures can be used such as, for example, a source side injection architecture.

The circuits ZADRIVER and ZBDRIVER, respectively shown in FIGS. 3 and 13, are used to generate ZAn, ZB and ZBB control signals for operating the system of FIG. 2. The ZADRV circuit of FIG. 3 is used to generate ZAn signals. FIG. 3 shows a ZA switch driver circuit 300 for providing the control signals for the 1:n switch 250 of FIG. 2. FIG. 13 shows a ZB driver 400 for providing the control signals for the 2:1 switch 236 of FIG. 2. The circuits Of FIG. 3 and FIG. 4. are the same except for some internal logic signal connections.

Table 1 shows the expected output of ZA as a function of mode of operation and of an enable input signal (ZAI).

TABLE 1

| ZA | | | |
|---|---|---|---|
| ZAI | Read | Prog. | Erase |
| +5 | +5 | +0 | −15 |
| +0 | +0 | +12 | +5 |

TABLE 2

| ZB | | | |
|---|---|---|---|
| ZBI | Read | Prog. | Erase |
| +5 | +0 | +12 | −15 |
| +0 | +5 | −2 | +0 |

FIG. 3 illustrates an embodiment of the ZA driver circuit 300 which has four components including: a switch circuit 302, a decoder circuit 304, a level shift circuit 306, and a −2 volt charge pump circuit 308. These components work together to generate the ZA output levels shown in Table 1. Both the decoder circuit 304 and the level shift circuit components can be modified to generate a different set of conditions for ZA.

Similarly, ZB and ZBB voltages are generated by a similar switch driver circuit shown in FIG. 13 with the output levels illustrated in Table 2. The decoder circuit 304 can be changed depending on what voltages are desired to be provided for control signal ZA at an output terminal 310 and for another control signal ZAB, if desired, at output terminal 312. The decoder circuit 304 can be changed to accommodate different sets of logic conditions.

The input signals to the ZA driver circuit 300 are a READ control signal provided at input terminal 320, an ERASE control signal provided at input terminal 322, and a program PGM signal provided at input terminal 324.

NPH1A and NPH2 are non-overlapping clock signals provided at input terminals 326, 328 and are used during either a program mode or an erase mode, as described herein below.

VCVP is the output voltage of a central positive charge pump and is provided at an input terminal 330. VCVP is +5 volts for a read mode or an erase mode of operation. VCVP is +12 volts for a program mode of operation.

V1NQP is the output voltage of the central negative charge pump and is provided at an input terminal 332. V1NQP is −12 volts for an erase mode of operation. V1NOP is 0 volts for a read mode or for a decode mode of operation.

VZMW is a control signal which is provided at input terminal 334. VZMW is +5 volts for a read or a program mode of operation and switches to 0 volts for an erase mode of operation.

ZAi, where i=0 to n, is a sector select control signal provided at input terminal 336 for selecting a sector i. One switch driver circuit is associated with each ZAi signal.

The outputs signal ZAB at the positive voltage output terminal 312 is either a positive voltage, VCC (+5) volt or +12 voltage, or 0 volts, depending upon the programming of the level shifter circuit 306, the output of which is connected directly to the positive voltage output terminal 312.

NPH1A and NPH2 are essentially non-overlapping clocks. These clocks are passed through the NAND gates using a switch. The switch is controlled by program mode PGM signal and ZAi. ZAi controls the clock enable. The other input to the NAND gates are the clock signals NPH1A and NPH2. ZAi enables the clock enable circuitry to provide a signal called clock enable CLKEN for program or erase modes of operation. For erase or program operations, the clock signals are enabled.

The level shift circuit 306 essentially shifts between zero volts and some positive voltage VCVP depending upon the inputs to the decoding circuitry. Two high voltage NOR gates provide zero or positive voltages to output terminals.

The structure and operation of the switch 302 is configured so that various voltage inputs are fed to the output terminal 310 depending on various inputs signals. The ZA output of the switch circuit 302 at output terminal 310 depends on the value of ZAi. As illustrated in Table 1, for ZAi equal to a logical ONE (VCC volts) level, ZA is +5 volts for a read mode of operation, 0 volts for a programming mode of operation, and −15 volts for an erase mode of operation. For ZAi equal to a logical ZERO (0 volts) level, ZA is 0 volts for a read mode of operation, +12 volts for a programming mode of operation, and +5 volts for an erase mode of operation.

A positive voltage output of the level shifter 306 goes into the switch 302 at Node 1. The output terminal 310 of the switch 302 provides voltages called ZA. All of the negative voltage outputs are provided on terminal 310 for ZA. ZA can be −15 volts, zero volts, or +5 volts, depending on the state of ZAi.

Different voltages pass through the switch 302. Positive voltages come into the switch 302 through node 1. Negative voltages pass through from input V1NOP to ZA. A −2 volt charge pump at node 4 provides a zero volt output while Node 1 is 0 volts. If a local charge pump C1 and C2 is operating, and NPH1A and NPH2 are gated on, −3 volts is pumped to ZA. Inside the switch 302 is a resistor called R1 which is an enhancement to the circuit for the local pump C1 and C2 and is used to isolate node 2 from the node ZA. This allows better efficiency in the pumping operation and isolates node 2 so that node 2 can swing more and generate better charge efficiency to pass V1NOP to ZA.

The local charge pump provided by C1 and C2 includes P-channel devices which function as small capacitors. If the capacitors C1, C2 are pumping, they generate −15 volts for the gates of transistors M2, M3 which pass a negative 15 volts V1NOP to node ZA. M3 provides the V1NOP voltage to node 310 through R1 and M5 provides the V1NOP voltage directly to node 310. The two paths are in parallel. If C1 and C2 are not pumping, they block the voltage between ZA and V1NOP. When C1 and C2 are pumping, −3 volts is provided on nodes 2 and 3 if V1NOP is zero volts. If V1NOP is −15 volts, then nodes 2 and 3 are pumped down to −15 volts.

For switching positive voltages to the ZA output terminal of FIG. 3, a P-channel device M4 is used.

C1 and C2 are PMOS transistors set up as two-plate capacitors. Nodes 2 and 3 pump negatively down to about minus three volts when Node 1 is a zero volts. And, depending upon what V1NOP is, pump down to as low as −3 volts below V1NOP, which is either 0 volts or −12 volts. Nodes 2 and 3 pump down to −15 volts. V1NOP comes from a main, centralized charge pump. The purpose of the local charge pump provided by C1 and C2 is to pass the V1NOP voltage to the ZA output terminal without significant loss in voltage through the P-channel devices M2 or M3. The path to node ZA involves a loss of one VT, which is three volts, so C1, C2 pump three volts lower than V1NOP.

The pumping action of C1, C2 is a two-phase pump in parallel. C1 has a length to width ratio of 15/20, while C2 has a width to length ratio of Since the current load on ZA could be large, resistor R1 has been placed between node 2 and the ZA output terminal. Resistor R1 isolates in time, through RC delays, the coupling to node 2 from ZA. On the clock phase when node 2 drops by coupling through C2, there is a RC delay from ZA to node 2. While node 2 has dropped and before charging takes place from ZA to node 2, the voltage on node 3 turns on the PMOS transistor which then passes the V1NOP voltage to node 3. The V1NOP voltage on node 3 keeps M2 turned on to provide V1NOP voltage to the ZA output terminal. M1 turns on relatively quickly because of the lower capacitance on node 3. On the next clock phase, when node 3 drops in voltage by coupling through C1, M2 shunts ZA to V1NOP. The resistor R1 effectively reduces the size that C2 must be to limit a Vtp drop between V1NOP and ZA.

The combination of the two capacitors C1 and C2 acting in parallel will make nodes 2 and 3 drop around minus three volts from the negative charge pump voltage VNOP, enabling M2 to pass a voltage to ZA from V1NOP.

When the oscillator is enabled and C1 and C2 are both pumping and node 1 is at 0 V, node 2 and node 3 are pumped negatively. They will pump around −3 V below V1NOP which is either −12 or 0 V. Therefore, ZB will be either −15 V or −3 V depending upon V1NOP. Note that when the C1–C2 switch is not pumping (i.e. when C1 and C2 are not coupling charge), the positive voltage on node 1 is passed to ZA. If it is required to force ZA to +0 V, the −2 V pump component 308 is started and the voltage from node 1 (0V) would be passed through M4 to R1 and to ZA Node 310.

For the positive voltage path, a positive voltage comes in from node 1 when C1 and C2 are disabled. However, the negative 2 volt pump 308 is turned on if 0V is to be forced on ZA. The node 1 voltage is passed directly through to the resistor R and the M4 transistor to ZA to pass zero volts to ZA. The purpose for the −2 volt pump 308 is to make up for the VT voltage drop through the switch transistors. Node 1 can vary between zero and some high positive voltage. The positive voltages at node 1 which go out to ZA are limited only by the breakdown characteristic of the P-channel device.

If V1NOP is zero volts because the main charge pump is not pumping down, ZA can be forced to some negative voltage by turning on C1 and C2 which pulls nodes 2 and 3 to −3 volts which is passed through R1 to drive ZA directly.

In summary, when the oscillator is enabled and C1 and C2 are pumping while node 1 is at 0V, node 2 and node 3 are pumped negatively. They will pump around −3 V below V1NOP which is either −12 or 0 V. Therefore, ZB will obtain either −15 V or −3 V depending upon V1NOP. When the switch is not pumping (i.e. C1 and C2 not coupling charge), node 1 is passed to ZA. If it is required to force ZA to +0 V, the −2 V pump component is started.

FIG. 3 also shows the logic circuits used to turn on the −2 volt pump 308. This pump circuit 308 is turned on in an erase mode and a program mode. If C1 and C2 are pumping, the −2 volt pump circuit 308 is off. Operation of the −2 volt pump circuit 308 depends on decoding of the clock enable signal CLKEN and NPH1A signals. The NOR gate 350 enables the −2 volt charge pump circuit 308 when clock enable signal CLKEN is LOW and when erase is HIGH. An input PMOS transistor capacitor 352 provides a voltage to the top end of the diode-connected PMOS transistor 354. The resistor in parallel with the diode-connected PMOS transistor 354 is a leakage resistor which allows charge to leak off the capacitor 352 when the NOR gate 350 is disabled. This provides −2 volts on the gate of PMOS transistor M4 to pass 0 volts from input terminal 1 through R1 to the ZA output terminal 310. When the voltage on terminal 1 is +5 volts, −2 volts is not required on the gate of M4. Transistor M5 next to M4 shuts off leakage and isolates node 1 from V1NOP.

A minimum set of circuit elements to practice the invention has no M5 and no R1. C1 and C2 are needed for the double pump operation to overcomes the Vtp voltage drops. The ZA output voltage is −2 volts below V1NOP. Using the double pump, if V1NOP is 0 volts, ZA is −2 volts.

The prior art provides only two choices for output voltages: a negative voltage or a positive voltage. The invention provides three choices: a negative voltage, zero volts, and an intermediate positive voltage provided by the level shifter.

FIG. 4 is a circuit diagram of a switch circuit for the switch driver circuit of FIG. 3 which includes a circuit for providing a PG output voltage from the ZB voltage. FIG. 5 is a diagram showing the PG voltage of FIG. 4 as a function of time, where the PG voltage has considerably less ripple than the ZB voltage.

FIG. 6 shows the V1NQP input voltage provided to the input terminal 332 of the switch circuit of FIG. 4. V1NQP has large voltage excursions due to variations in the load on input terminal 332.

FIG. 7 the Node 3 voltage varying as it is pumped by NPH1A through C1.

FIG. 8 shows the ZA voltage at terminal 310 of FIG. 3 which also has rather large voltage excursions.

FIG. 9A shows the PH1B and the PH2B clock signals on an expanded time scale. FIG. 9B shows the voltages A&ZB, B, V1NQP, and PG as functions of time with an expanded time scale.

FIG. 10 shows the voltages A&ZB and B on an expanded time scale to show Node A leading ZB because of the RC delay caused by resistor R1.

FIG. 11 shows another embodiment of a ZA DRIVER switch circuit in which Node 2 is connected directly to the ZB output terminal.

FIG. 12 is a circuit diagram of still another embodiment of a ZA DRIVER circuit in which two series transistors are connected to Node 1 to provide improved voltage breakdown performance.

FIG. 13 is a circuit diagram of another embodiment of a switch according to the invention. FIG. 4 illustrates how the ZB voltages are generated. It is very similar to FIG. 3 for ZA and shows a different king of decoding circuitry. The input from ZB1 to the level shifter goes through a NOT circuit, that is through only one inverter, whereas FIG. 3 uses two inverters.

FIG. 14 is an array application of the invention which uses 4 ZADRV circuits and 4 ZBDRV circuits, which results in an array of sectors. It is also easy to decode the ZBI signals to group multiple groups of ZADRV circuit together to form larger sectors. FIG. 14 illustrates how multiple ZADRV and ZBDRV drivers are used to build up a NOR array type of memory architecture. The single, centralized positive charge pump and the single, centralized negative charge pumps shown at the bottom of FIG. 14 are multiplexed through multiplex circuits into the memory array. The ZADRV and ZBDRV drivers supply the necessary signals to control the switches. Note that the ZADRV circuits of FIG. 14 are shown in detail in FIG. 3 and the ZBDRV circuits of FIG. 14 are shown in detail in FIG. 13. The oscillator signals OSC at the top of FIG. 14 going to the ZADRV and ZBDRV circuits provide signals NPH1A and the NPH2. The other control signals ZAI and ZBI are not shown. Multiple word lines can be grouped together to form larger sectors. The ZB signals control the voltage provided from either the centralized positive charge pump or the centralized negative charge pump. The ZA signals are the word line select signals which control how many word lines are selected.

FIG. 15 shows another type of control gate decoding structure with control voltages applied thereto as derived from ZA DRIVER circuits. Various nodes are shown with three different voltages indicated as being applied thereto for erase, program, and read operations. Rather than a NOR structure FLASH array memory structure, a source-side injection type of memory array, or so-called contactless array type of architecture, is shown. Contactless means that there are very few metal contacts to be made in the array. In contrast, in a NOR type array a metal contact is needed for every cell because bit line are run vertically and a contact is made to the metal bit line for every cell with one contact for every two cells. For a source-side injection architecture, one contact is used for every 16 or 32 cells. Instead of running the cells vertically, this architecture rotates the cells ninety degrees as a way of compacting the array. A 2-to-1 ZB switch is provided and 1-to-n ZB switch are provided. The lines run down vertically instead of horizontally across the word lines.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A switch circuit which selectively provides a negative voltage, an intermediate voltage, or a positive voltage from a single central positive voltage supply and from a single central negative-voltage supply, comprising:

a first pump capacitor (C1) having a first terminal and a second terminal (Node 3), where the first terminal is connected to the output terminal of a first alternating signal source and where the second terminal is connected to a gate terminal of a first series pass PMOS transistor (M2);

where the first series pass transistor (M2) has a first terminal connected to a negative voltage supply terminal (V1NOP) and where the first series pass transistor (M2) has a second terminal connected to the switch circuit output terminal;

a second pump capacitor (C2) having a first terminal and a second terminal (Node 2), where the first terminal is connected to the output terminal of a second, oppositely-phased alternating signal source, where the second terminal of the second pump capacitor is connected to one terminal of a series resistor (R1), where a second terminal of the series resistor is connected to the switch output terminals and where the second terminal of the second pump capacitor is connected to a gate terminal of a second series pass PMOS transistor (M1);

where a first terminal of the second series pass transistor (M1) is connected to the negative voltage supply terminal (V1NOP) and where a second terminal of the second series pass transistor (M1) is connected to the second terminal of the first pump capacitor (C1) and the gate terminal of the first series pass PMOS transistor (M2);

wherein the combination of the first pump capacitor and the second pump capacitor acting in parallel makes nodes 2 and 3 drop approximately minus three volts from the negative voltage supply (V1NOP) and enable the first series pass transistor (M2) to pass voltage from the negative voltage supply (V1NOP) to the switch output terminal;

a positive voltage supply terminal (Node 1), where a first terminal of a third series pass PMOS transistor (M4) is connected to the positive voltage supply terminal and where a second terminal of the fourth series pass transistor is connected to the first terminal of the series resistor to provide a positive output voltage at the switch output terminal;

a logic decoder circuit receiving logic control signals and providing a clock enable circuit for gating the two clock signals having opposite phases to provide the first alternating signal and the second alternating signal to respective first and second pump capacitors (C1 and C2);

a level shifter circuit for shifting the voltage level of the positive voltage provided at the positive voltage supply terminal;

whereby a positive voltage, a negative voltage, and an intermediate voltage can be provided to the switch output terminal.

2. The switch circuit of claim 1 including a −2 volt charge pump providing an output voltage connected to a gate terminal of the third series path transistor for shifting the output voltage level of the positive output voltage at the switch output terminal.

3. The switch circuit of claim 1 wherein a negative voltage is not applied to the first terminals off the first and second series pass transistors so that −3 volts is provided on the switch output terminal.

4. The switch circuit of claim 1 wherein fie logic decoder circuit has respective input terminals for receiving a read mode control signal READ, a program mode control signal PGM, and an erase mode control signal ERASE to program the switch circuit for selectively providing a negative voltage, an intermediate voltage, and a positive voltage from a single central positive-voltage supply or from a single central negative-voltage supply for reading, programming, and erasing negative-gate-erase sectors of memory devices formed in a twin-well CMOS process.

5. A system for providing read, programming, and erase voltages to sectors of negative-gate-erase sectors of memory cells, comprising a single negative charge pump providing a negative output voltage;

a single positive charge pump providing a positive output voltage;

a first switch which has a first input terminal connected to the negative output voltage, which has a second input terminal connected to the positive output voltage, and which has an output terminal which is selectively connected to the first input terminal of to the second input terminal, wherein said switch includes control terminals at which are provided first-switch control signals for selectively connecting the first or second input terminals of the first switch to the output terminal of the first switch;

a ZBDRV switch drive circuit which selectively provides a negative voltage, an intermediate voltage, or a positive voltage from the single negative charge-pump or from the single negative charge pump to the control terminals of the first switch;

a sector switch array having an input terminal connected to the output terminal of the first switch including a plurality of switch transistors, each of which switch transistors has an input terminal connected to the output terminal of the first switch, wherein each of which switch transistors has an output terminal connected to a respective sector of negative-gate-erase memory cells for providing read, programming, and erase voltages to said respective sectors and wherein each of said plurality of switch transistors includes a control terminal;

a plurality of ZADRV sector switch drive circuits each of which respectively provide a control signal to an associated switch transistor of the sector switch array for selectively combining respective sectors of negative-gate-erase memory cells for providing read, programming, and erase voltages to said respective combined sectors.

6. The system of claim 5 wherein the ZBDRV switch drive circuit and each of the plurality of ZADRV sector switch drive circuits each includes a switch circuit which selectively provides a negative voltage, an intermediate voltage, or a positive voltage from a single central positive-voltage supply and from a single central negative-voltage supply, comprising:

a first pump capacitor (C1) having a first terminal and a second terminal (Node 3), where the first terminal is connected to the output terminal of a first alternating signal source and where the second terminal is connected to a gate terminal of a first series pass PMOS transistor (M2);

where the first series pass transistor (M2) has a first terminal connected to a negative voltage supply terminal (V1NOP) and where the first series pass transistor (M2) has a second terminal connected to the switch circuit output terminal;

a second pump capacitor (C2) having a first terminal and a second terminal (Node 2), where the first terminal is connected to the output terminal of a second, oppositely-phased alternating signal source, where the second terminal of the second pump capacitor is connected to one terminal of a series resistor (R1), where a second terminal of the series resistor is connected to the switch output terminal, and where the second terminal of the second pump capacitor is connected to a gate terminal of a second series pass PMOS transistor (M1);

where a first terminal of the second series pass transistor (M1) is connected to the negative voltage supply terminal (V1NOP) and where a second terminal of the second series pass transistor (M1) is connected to the second terminal of the first pump capacitor (C1) and the gate terminal of the first series pass PMOS transistor (M2);

wherein the combination of the first pump capacitor and the second pump capacitor acting in parallel makes nodes 2 and 3 drop approximately minus three volts from the negative voltage supply (V1NOP) and enable the first series pass transistor (M2) to pass voltage from the negative voltage supply (V1NOP) to the switch output terminal;

a positive voltage supply terminal (Node 1), where a first terminal of a third series pass PMOS transistor (M4) is connected to the positive voltage supply terminal and where a second terminal of the fourth series pass transistor is connected to the first terminal of the series resistor to provide a positive output voltage at the switch output terminal;

a logic decoder circuit receiving logic control signals and providing a clock enable circuit for gating the two clock signals having opposite phases to provide the first alternating signal and the second alternating signal to respective first and second pump capacitors (C1 and C2);

a level shifter circuit for shifting the voltage level of the positive voltage provided at the positive voltage supply terminal;

whereby a positive voltage, a negative voltage, and an intermediate voltage can be provided to the switch output terminal.

7. The system of claim 5 wherein the switch circuit includes a −2 volt charge pump providing an output voltage connected to a gate terminal of the third series path transistor for shifting the output voltage level of the positive output voltage at the switch output terminal.

8. The system of claim 5 wherein a negative voltage is not applied to the first terminals off the first and second series pass transistors so that −3 volts is provided on the switch output terminal.

9. The system of claim 5 wherein the logic decoder circuit has respective input terminals for receiving a read mode control signal READ, a program mode control signal PGM, and an erase mode control signal ERASE to program the switch circuit for selectively providing a negative voltage, an intermediate voltage, and a positive voltage from a single central positive-voltage supply or from a single central negative-voltage supply for reading, programming, and erasing negative-gate-erase sectors of memory devices formed in a twin-well CMOS process.

* * * * *